(12) United States Patent
Hadley

(10) Patent No.: US 7,542,008 B2
(45) Date of Patent: *Jun. 2, 2009

(54) DOUBLE INDUCTOR LOOP TAG ANTENNA

(75) Inventor: Mark A. Hadley, Newark, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/951,299

(22) Filed: Dec. 5, 2007

(65) Prior Publication Data

US 2008/0100420 A1 May 1, 2008

Related U.S. Application Data

(63) Continuation of application No. 10/848,643, filed on May 18, 2004, now Pat. No. 7,324,061.

(60) Provisional application No. 60/472,258, filed on May 20, 2003.

(51) Int. Cl.
*H01Q 1/40* (2006.01)
(52) U.S. Cl. .................. 343/873; 343/870; 340/572.7
(58) Field of Classification Search ........... 343/870, 343/872, 873; 340/572.7, 10.2, 505, 673; 342/51
See application file for complete search history.

(56) References Cited

U.S. PATENT DOCUMENTS

| | | | |
|---|---|---|---|
| 5,008,647 A * | 4/1991 | Brunt et al. ............... 340/432 |
| 5,545,291 A | 8/1996 | Smith et al. | |
| 5,608,417 A | 3/1997 | de Vall | |
| 6,018,299 A * | 1/2000 | Eberhardt ............... 340/572.7 |
| 6,028,564 A | 2/2000 | Duan et al. | |
| 6,072,383 A | 6/2000 | Gallagher et al. | |
| 6,107,920 A | 8/2000 | Eberhardt et al. | |
| 6,181,287 B1 | 1/2001 | Beigel | |
| 6,252,508 B1 | 6/2001 | Vega et al. | |
| 6,281,038 B1 | 8/2001 | Jacobsen et al. | |
| 6,291,896 B1 | 9/2001 | Smith | |
| 6,320,753 B1 * | 11/2001 | Launay ............... 361/760 |
| 6,384,727 B1 | 5/2002 | Diprizio et al. | |
| 6,535,175 B2 | 3/2003 | Brady et al. | |
| 6,555,408 B1 | 4/2003 | Jacobson et al. | |
| 6,606,247 B2 | 8/2003 | Credelle et al. | |
| 6,925,701 B2 | 8/2005 | Eckstein et al. | |
| 6,980,184 B1 | 12/2005 | Stewart et al. | |
| 7,324,061 B1 * | 1/2008 | Hadley ............... 343/873 |

* cited by examiner

*Primary Examiner*—Douglas W Owens
*Assistant Examiner*—Jimmy T Vu
(74) *Attorney, Agent, or Firm*—Blakely, Sokoloff, Taylor & Zafman LLP

(57) ABSTRACT

An RFID tag in one embodiment. The RFID tag includes at least one integrated circuit and an antenna pattern coupled to the integrated circuit, wherein the antenna pattern has an inductor pattern which limits the effect of misplacement of the integrated circuit relative to the inductor pattern. Other embodiments and methods of making these apparatuses are described.

6 Claims, 8 Drawing Sheets

SCALE REFERENCE

ANTENNA LAYOUT. PB-TAG

ANTENNA LAYOUT, SA-TAG

DOUBLE INDUCTOR LOOP TAG ANTENNA

RELATED APPLICATION

This application is a continuation application of U.S. application Ser. No. 10/848,643, filed May 18, 2004, now U.S. Pat. No. 7,324,061 entitled "Double Induction Loop Tag Antenna" and is also related to and claims the benefit of U.S. Provisional Patent Application Ser. No. 60/472,258, filed May 20, 2003, which is herby incorporated by this reference in its entirety.

GOVERNMENT RIGHT TO APPLICATION

This invention was made with U.S. Government support, and the U.S. Government has certain rights to this invention.

BACKGROUND

The present invention relates to devices with electronic components, such as an antenna with an inductor.

Radio Frequency Identification (RFID) tags allow for the remote identification of objects through the use of radio waves (electromagnetic radiation in a radio frequency spectrum). RFID tags may, for example, be placed on products in a warehouse such that an inventory of existing products in the warehouse may be performed electronically merely by interrogating each RFID tag on the products. RFID tags typically include at least one IC (integrated circuit) which acts as a radio receiver and transmitter and an antenna. The antenna may include an inductor, such as an inductive loop in the antenna's layout or design. The one purpose of the inductor is to cancel the reactance cause by the intrinsic capacitance of the IC. When the inductor is at its optimum value, the antenna can couple the maximum amount of RF energy to and from the IC.

One method of manufacturing an RFID tag is to place one or more ICs in a carrier substrate (a first substrate) and attach the carrier substrate to an antenna substrate (a second substrate). Both substrates may be flexible and the antenna pattern, with an inductor, may be printed or otherwise formed on the antenna substrate. Examples of such a method of manufacture is described in U.S. patent application Ser. No. 09/872,985, filed May 31, 2001, which is hereby incorporated herein by reference. FIG. 3 of this application shows an RFID tag 300 that is manufactured by combining and interconnecting a carrier strap 301, which includes at least one IC, and a receiving substrate 310 which includes an antenna 311. An IC in the carrier strap 301 may be placed into a receptor region of the carrier strap 301 by a fluidic self-assembly (FSA) process, such as a process described in U.S. Pat. No. 5,545,291 which is hereby incorporated herein by reference. Alternatively, the IC may be placed into the receptor region by a robotic pick and place operation.

This manufacturing process requires that there be some registration of the carrier strap 301 relative to the receiving substrate so that the electrical contacts on the carrier strap 301 matingly engage the corresponding electrical contacts of the receiving substrate 310. This registration requirement tends to complicate the manufacturing process and tends to increase the effective cost of the manufacturing process. This registration can become important when an inductor is used in the antenna pattern on the receiving substrate.

FIGS. 1A and 1B show two examples of RFID tags which are manufactured by combining a carrier strap, which is carrier strap 10 or carrier strap 14 in FIGS. 1A and 1B respectively, with an antenna or receiving substrate which includes an antenna pattern that has one inductor. The antenna pattern 11 of FIG. 1A includes an inductive loop (or inductor) 12, and the antenna pattern 15 of FIG. 1B includes an inductive loop 16. The placement of the carrier strap (e.g. straps 10 or 14) onto the respective receiving substrate will effect the value of the inductance. For example, if the carrier strap is positioned closer to the left side of the pattern in FIG. 1A, then the length and area of the inductive loop are increased relative to an inductive loop formed by a strap which is positioned closer to the right side of the pattern. The desired inductance of the loops is a function of the operating frequency. For example, at an operating frequency of 2.45 GHz, a desired inductor value may be about 7.2 times smaller than a desired inductor value at 915 MHz (based on the calculation of $(2.45/0.915)^2$). This small inductor is very sensitive to the strap's location since the strap is part of the inductor loop. The smaller the loop the greater the variation in the inductance value with a given change in the strap position.

SUMMARY OF THE DISCLOSURE

This disclosure includes a description of an RFID tag having an antenna with a double inductor loop where two inductors are coupled in parallel. As described below, this makes the positioning of a strap (or an IC) onto the receiving substrate less sensitive to registration errors. This also tends to produce higher manufacturing yields (more acceptable products, e.g. RFID tags, can be manufactured) and the performance characteristics of the RFID tags tend to be more similar. Other embodiments and methods are described also.

BRIEF DESCRIPTION OF THE FIGURES

FIG. 4 is a top view of the antenna substrate.

FIG. 8 represents an RFID tag such as that shown in FIG. 2 or FIG. 3.

DETAILED DESCRIPTION

Figure 2:
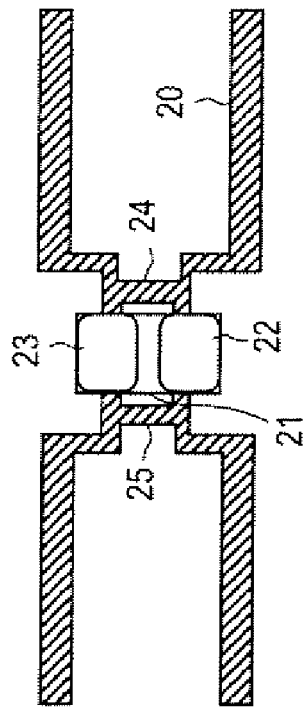
FIG. 2 is an example of one embodiment of the present invention in which an RFID tag includes an antenna pattern having two symmetrical inductor loops.
Figure 3:
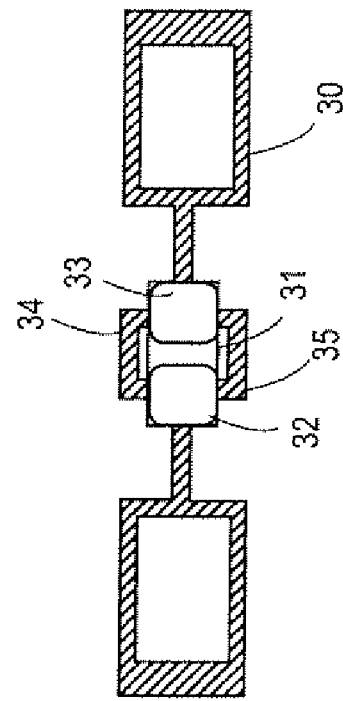
FIG. 3 shows another exemplary embodiment of the present invention of an RFID tag having an antenna pattern which includes two symmetrical inductor loops.

FIGS. 2 and 3 show two exemplary embodiments of RFID tags according to the present invention. FIG. 2 may be considered a replacement for the RFID tag shown in FIG. 1A, and FIG. 3 may be considered a replacement for the RFID tag shown in FIG. 1B.

Referring to FIG. 2, the RFID tag shown in this figure includes an antenna pattern 20 which includes two inductor loops 24 and 25 which are part of the antenna pattern 20. Electrical contacts such as electrical contact pads 22 and 23 are also part of the antenna pattern and serve to make electrical contact to two corresponding electrical contact pads on a carrier strap 21 or on an integrated circuit which is disposed in a receptor region of the carrier strap 21. Thus, the internal circuitry within the integrated circuit is coupled to the antenna pattern through the electrical contacts 22 and 23. Typically, the integrated circuit disposed on the carrier strap 21 includes the necessary RF circuitry to receive RF signals through the antenna pattern 20 and to respond to a tag reader by transmitting one or more signals back to a remotely located reader through the antenna pattern 20. At least one integrated circuit may be disposed on the carrier strap 21 and this circuit typically also includes the memory for storing a value such as a tag or identifying value which identifies the RFID tag and thus the object which is associated with the RFID tag.

Figure 1A:
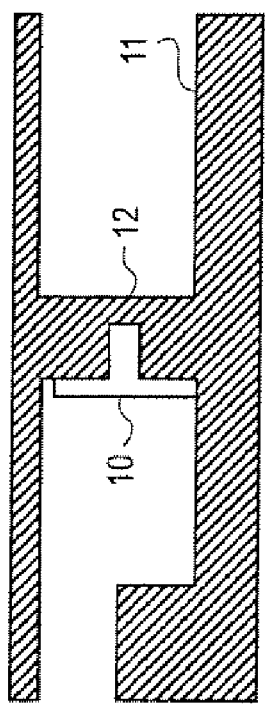
FIG. 1A shows an example of an RFID tag having an antenna pattern which includes one inductor loop.
Figure 1B:
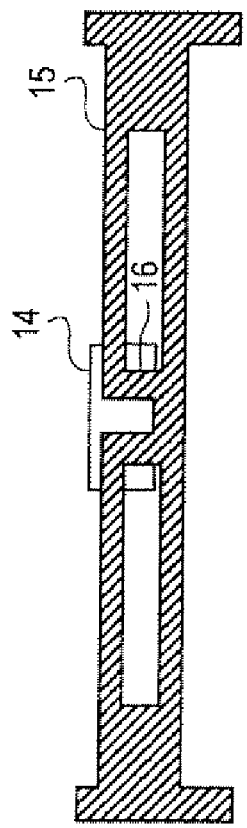
FIG. 1B shows another RFID tag having an antenna pattern which includes one inductor loop.

The design of FIG. 2 has several advantages relative to the design shown in FIG. 1A. First, the physical size of the inductor which results from the parallel inductor loops 24 and 25 is twice as large, so strap misalignment has half the effect on an individual inductor. Secondly, since the two inductors are in parallel, if the strap is placed such that one inductor loop is increased, the other will be decreased in inductance value. The resulting inductance change of the combined inductors in parallel is very small.

Mathematically, the two inductors L1 and L2 are:

$$L1 = L + \Delta L, \text{ and}$$

$$L2 = L - \Delta L,$$

where $\Delta L$ is the change in inductance due to an alignment misregistration of the strap relative to the receiving substrate. If the strap is placed so that one inductor (L1) is increased (by the amount $\Delta L$), then the other inductor (L2) is decreased by the same amount ($\Delta L$).

The combined inductor $L_c$ which results from the parallel combination of inductors is:

$$L_c = \frac{L1 L2}{L1 + L2};$$

substituting in the values of L1 and L2 gives:

$$L_c = \frac{(L + \Delta L)(L - \Delta L)}{2L} = \frac{L}{2} - \frac{\Delta L^2}{2L}$$

Since $\Delta L$ is small, the term with $\Delta L^2$ is even smaller and thus a parallel inductor loop design is much less sensitive to the strap's location. In the foregoing analysis, the two inductors L1 and L2 correspond to the inductor loops 24 and 25 of FIG. 2. One exemplary IC that may be used with the present invention has a specific intrinsic capacitance (C) that is to first order independent of frequency. This capacitance gives rise to a reactance of $-1/\omega C$ where $\omega$ is $2\pi f$, and f is the frequency. The desired value of the inductor is such that the reactance from the inductor, $\omega L$, cancels the reactance from the capacitor. Setting $1/\omega C = j\omega L$ gives the resonance condition of $\omega^2 LC = 1$ or $L = 1/\omega^2 C$. Thus the desired inductance is inversely proportional to the frequency.

FIG. 3 shows another example of an RFID tag having an antenna pattern 30 which includes two inductor loops 34 and 35 which are coupled to electrical contacts or contact pads 32 and 33 which allow the antenna pattern to make contact with an integrated circuit disposed in the carrier strap 31. The RFID tag of FIG. 3 works in a similar manner to the RFID tag of FIG. 2. For example, a reader sends out an interrogation signal which is received by the antenna pattern 30 and conveyed through the electrical contacts 32 and 33 to the integrated circuit in the carrier strap 31 which in turn responds by transmitting a signal through the antenna pattern 30 back to the reader. The signal may contain a tag value or an identifying value which specifies the identity of the tag. As with FIG. 2, the RFID tag of FIG. 3 includes the ability to limit the effect of misplacement of the carrier strap which holds the integrated circuit relative to the inductor pattern and to the antenna pattern. As noted above, the change in one inductor is compensated by a change in a different direction for the other inductor such that the overall change of the parallel inductors is small.

Figure 4:
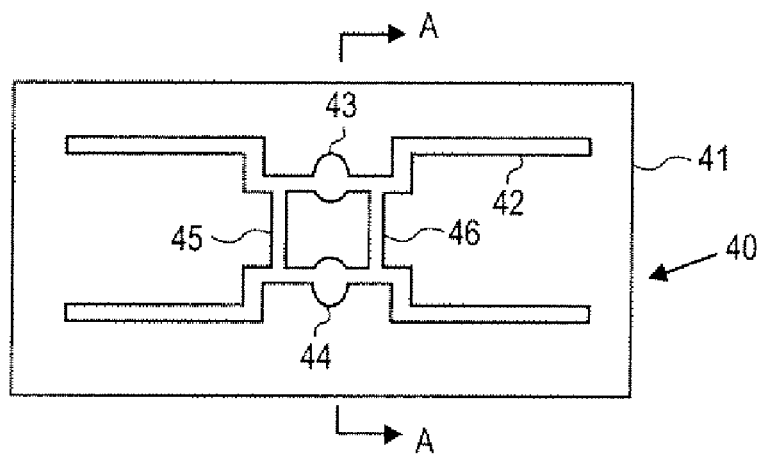
FIG. 4 shows an exemplary embodiment of an antenna substrate having an antenna pattern with two symmetrical inductor loops.

FIG. 4 shows the antenna pattern of the RFID tag of FIG. 2 without, in the case of FIG. 4, the carrier strap 21. The antenna pattern 42 is printed or etched or deposited or otherwise formed on a substrate 41 in order to create an antenna substrate or receiving substrate 40. The substrate 41 may be flexible which allows the RFID tag to be placed on objects of various shapes. The antenna pattern 42 includes two electrical contact pads 43 and 44 and further includes two inductor loops in parallel, shown as inductor loops 45 and 46 in FIG. 4. It can be seen that relative to an axis which bisects the electrical contacts 43 and 44 that the two inductors 45 and 46 are symmetrical about that axis which can be seen in the top plane view of FIG. 4 of the receiving or antenna substrate 40.

Figure 5:
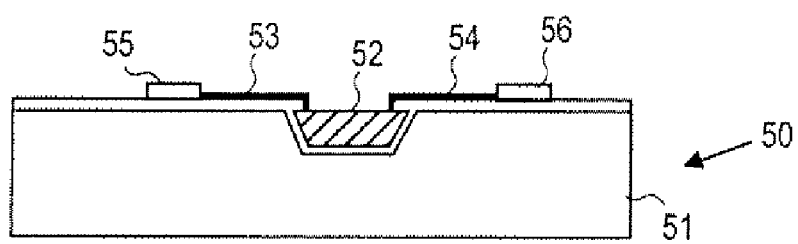
FIG. 5 is a cross-sectional view of a carrier substrate having an integrated circuit which may be used as part of an RFID tag.

FIG. 5 is a cross-sectional view of a carrier strap 50 formed by a substrate 51 which includes a receptor region which receives at least one integrated circuit, such as the integrated circuit 52. A carrier strap 50 further includes conductors 53 and 54 which couple to respective contact pads on the integrated circuit 52. These conductors 53 and 54 are in turn coupled to contact pads 55 and 56 respectively. Contact pads 55 and 56 form large contact areas which can be used to contact to corresponding contacts, such as contacts 43 and 44 on the antenna substrate 40. The contact pads 55 and 56 are separated by an insulating layer from the substrate 51 as shown in the cross-sectional view of FIG. 5.

Figure 6:
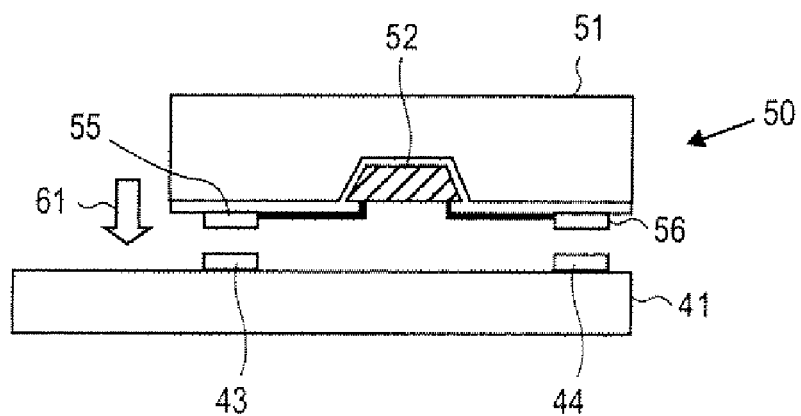
FIG. 6 is a cross-sectional view showing the assembly process of combining a carrier substrate with a receiving substrate to form, in one exemplary embodiment, an RFID tag.

FIG. 6 shows, in cross-sectional view, the assembly of the carrier strap 50 with the receiving substrate or antenna substrate 40. This occurs as shown by the arrow 61 by bringing a carrier substrate 50 into contact with the antenna substrate which includes the substrate 41 and the contacts 43 and 44. It is this operation shown in FIG. 6 which requires registering or aligning the carrier substrate 50 relative to the receiving substrate such that the contact 55 makes contact with the contact 43 and the contact 56 makes contact with the contact 44 in relatively precise alignment as shown in FIG. 6. However, to the extent that the alignment is not as desired, embodiments of the present invention tend to limit the effect of the misplacement or misalignment of the two successive contact pads so that the change in inductance in the overall inductor is relatively small as described herein.

Figure 7:
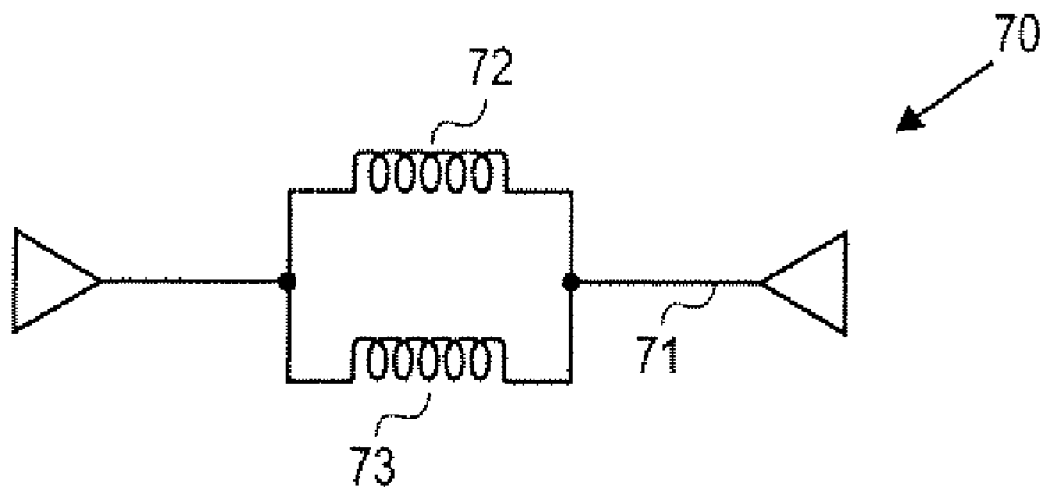
FIG. 7 is an electrical schematic representing an antenna pattern, such as the antenna pattern shown in FIG. 4.
Figure 8:
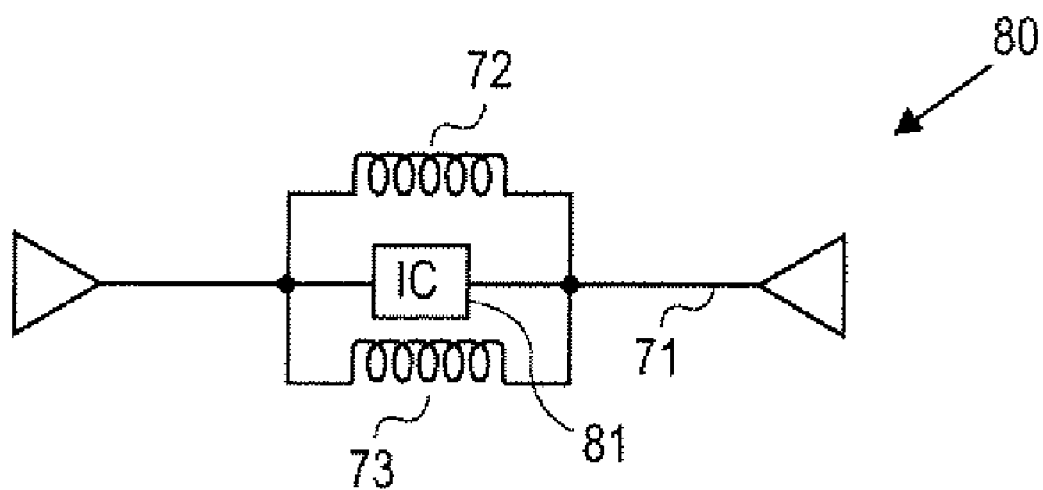
FIG. 8 is an electrical schematic showing the assembled RFID tag with at least one integrated circuit coupled to the antenna pattern such that a pair of inductor loops, such as a symmetrical inductor loop as shown in FIG. 4 is coupled in parallel across the contact pads of the integrated circuit.

FIG. 7 shows an electrical schematic representing an antenna pattern before it is connected to an integrated circuit. As noted above, this antenna pattern may be printed, or etched, or deposited, or otherwise created on a flexible substrate or other substrate in order to create an antenna substrate or receiving substrate. As shown in FIG. 7, the antenna substrate 70 includes an antenna pattern 71 which further includes two inductors 72 and 73 coupled electrically in parallel which are in turn coupled in series between two antenna portions (a left antenna portion and a right antenna portion) as shown in FIG. 7. This antenna pattern may be used for an RFID tag or for another electronic device. FIG. 8 shows another electrical schematic of the antenna pattern of FIG. 7 which has now been connected to an integrated circuit 81 to form an RFID tag or another electronic device. The electronic device 80 includes the integrated circuit 81 which is coupled in parallel with the inductors 72 and 73 and is coupled in series between the left and right antenna portions formed in the antenna pattern 71. It will be appreciated that the circuit of FIG. 8 represents a completed RFID tag such as the RFID tag shown in FIG. 3. In this case, the inductor 72 corresponds to the inductor 34 and the inductor 73 corresponds to the inductor 35 of FIG. 3.

Figure 9:
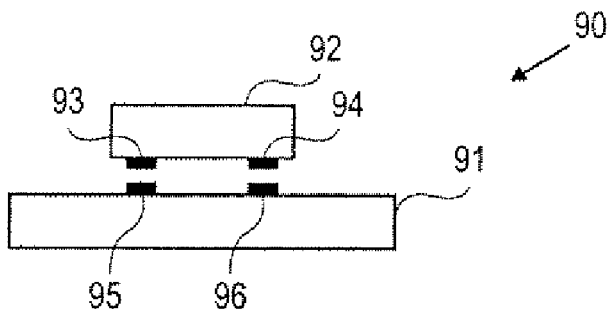
FIG. 9 is another exemplary embodiment of a process for assembling an RFID tag or other device where a flip chip is coupled to a receiving substrate directly without a carrier substrate.

Various embodiments of the present invention may be utilized for devices where the carrier strap is robotically placed onto a receiving substrate. Further, various embodiments of the present invention may be used with a flip chip architecture where an integrated circuit is directly coupled to a receiving substrate without a carrier strap, such as the example shown in FIG. 9. In FIG. 9, it can be seen that a flip chip integrated circuit 92 includes contact pads 93 and 94 which are designed to electrically couple to contact pads 95 and 96 on a receiving substrate 91 which may include an antenna pattern as described herein. The electronic device of FIG. 9 may be an RFID tag or another electrical device.

Figure 10:
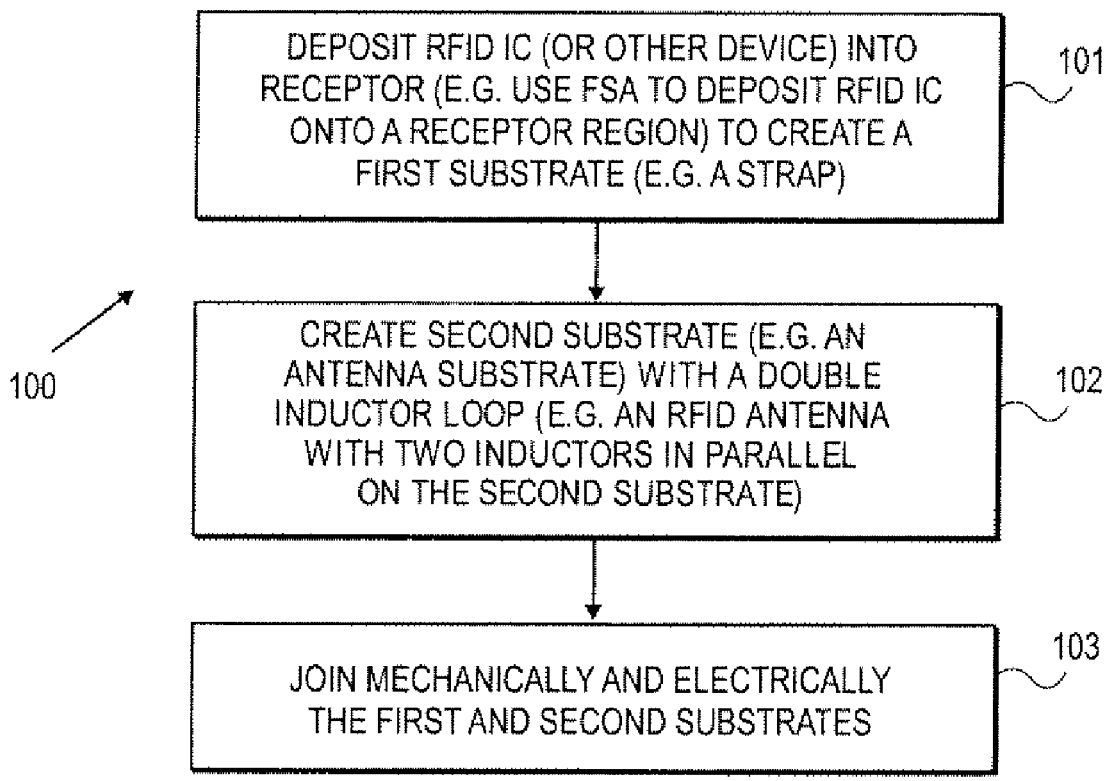
FIG. 10 is a flowchart depicting one exemplary method of forming a device of the present invention such as an RFID tag.

FIG. 10 shows an example of a method 100 of creating certain embodiments of the present invention, such as an RFID tag. The method begins in operation 101 by depositing an RFID integrated circuit into a receptor or onto a receptor region to create a first substrate which may be a carrier strap, such as the carrier strap 50 shown in FIG. 5. The RFID integrated circuit may be deposited into a receptor region through the use of fluidic self assembly or may be placed there by other techniques including, for example, robotic pick and place operations. The cross-sectional view of FIG. 5 shows the result in one embodiment of operation 101, where an integrated circuit 52 has been deposited into a receptor region in the substrate 51. In operation 102, a second substrate such as an antenna substrate is created with a double inductor loop. An example of this antenna substrate is shown in FIG. 4. Then in operation 103, the second substrate is mechanically and electrically combined with the first substrate in order to form an RFID tag or other device. FIG. 6 shows in cross-sectional view an example of this operation 103.

It will be appreciated that there are other alternative manufacturing techniques which may be used to create the various apparatuses of the present invention.

Figure 11:
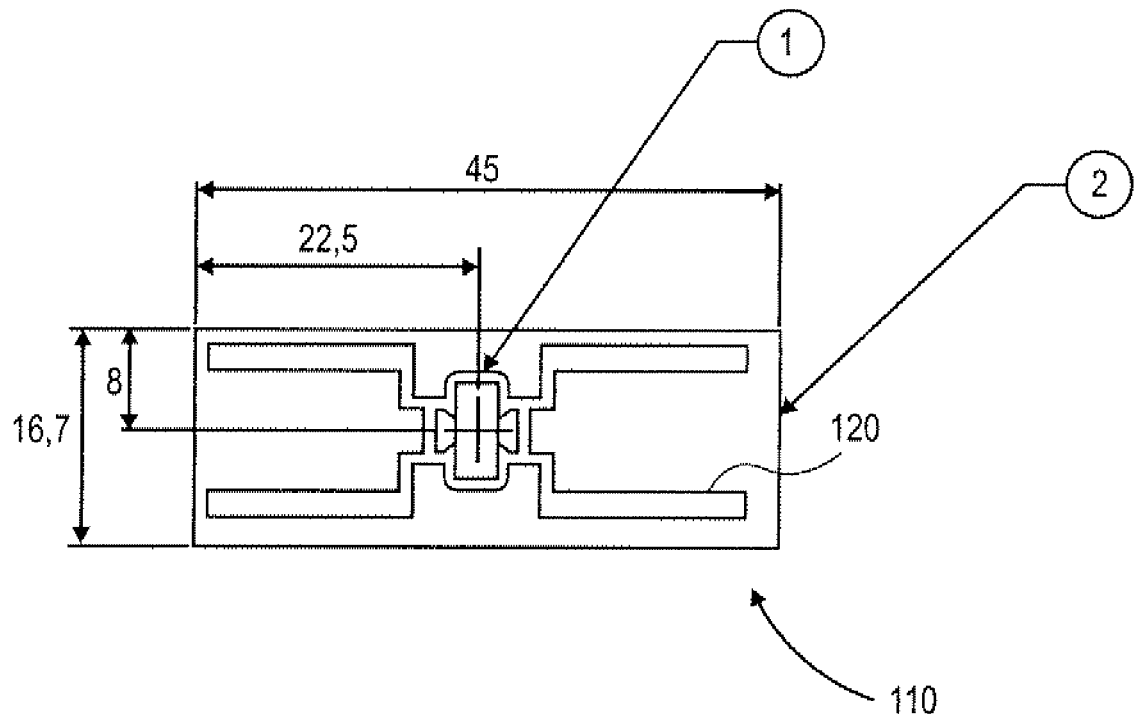
FIG. 11 shows an assembled RFID tag of one exemplary embodiment.
Figure 12:
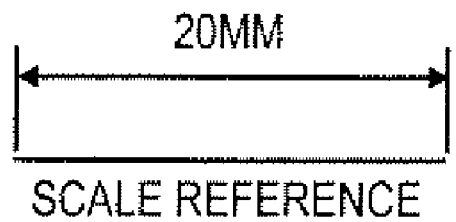
FIG. 12 shows an exemplary antenna layout pattern with a scale reference.
Figure 12:
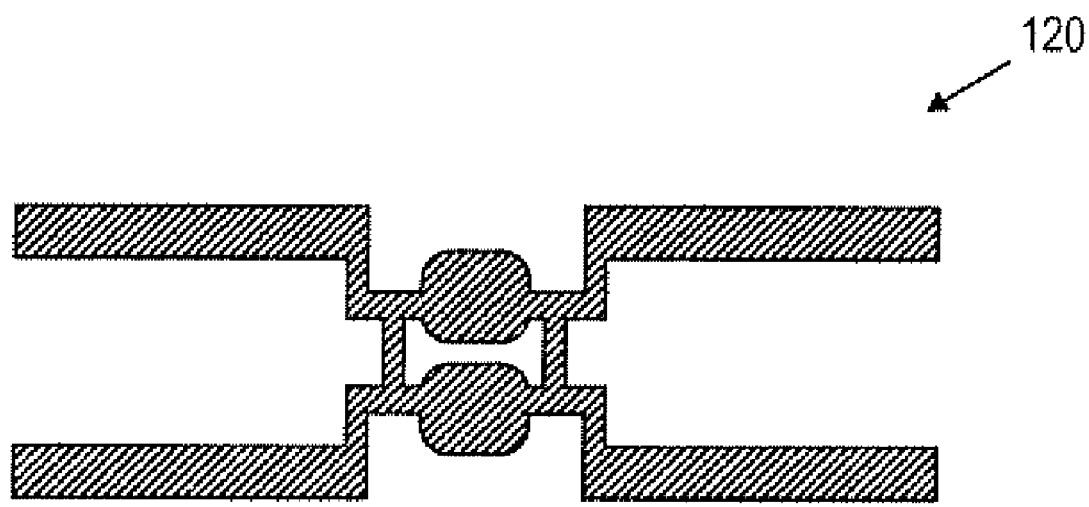

FIGS. 11, 12, 13, and 14 illustrate two embodiments of RFID tags and their associated antenna patterns. These figures also show dimensions of a particular embodiment. It will be appreciated that these dimensions are for a particular embodiment and other dimensions may be utilized depending upon the desired operating frequency and other parameters of an RFID tag. FIG. 11 shows in a top plane view the dimensions of an RFID tag of the type shown in FIG. 2. This RFID tag includes a carrier strap, one which includes at least one integrated circuit, and also includes an antenna pattern 120 which is on the receiving substrate which has been combined with the carrier strap. The resulting RFID tag as shown in FIG. 11 is approximately 45 millimeters in length and 16.7 millimeters in width as shown in FIG. 11. FIG. 12 shows the antenna pattern 120 which is also shown in FIG. 11. It can be seen that this antenna pattern resembles the antenna pattern 20 shown in FIG. 2. From the top plane view shown in FIG. 12, it can be seen that there are two inductor loops which are coupled in parallel.

Figure 13:
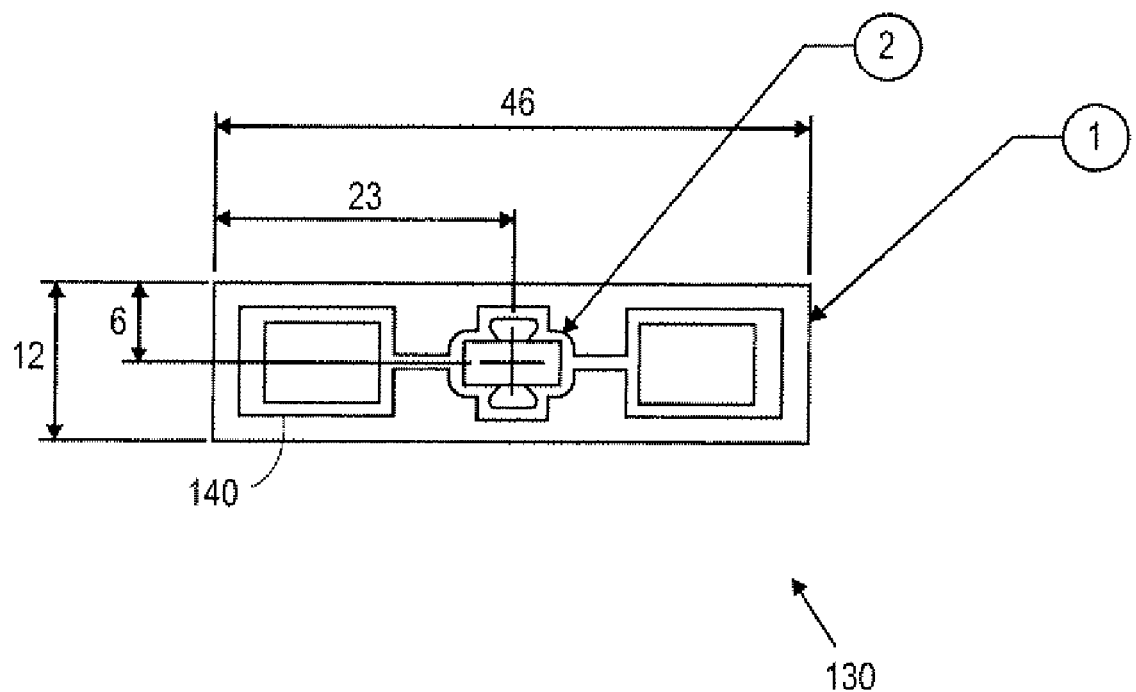
FIG. 13 is another exemplary embodiment of an assembled RFID tag with measurements shown on the figure.
Figure 14:
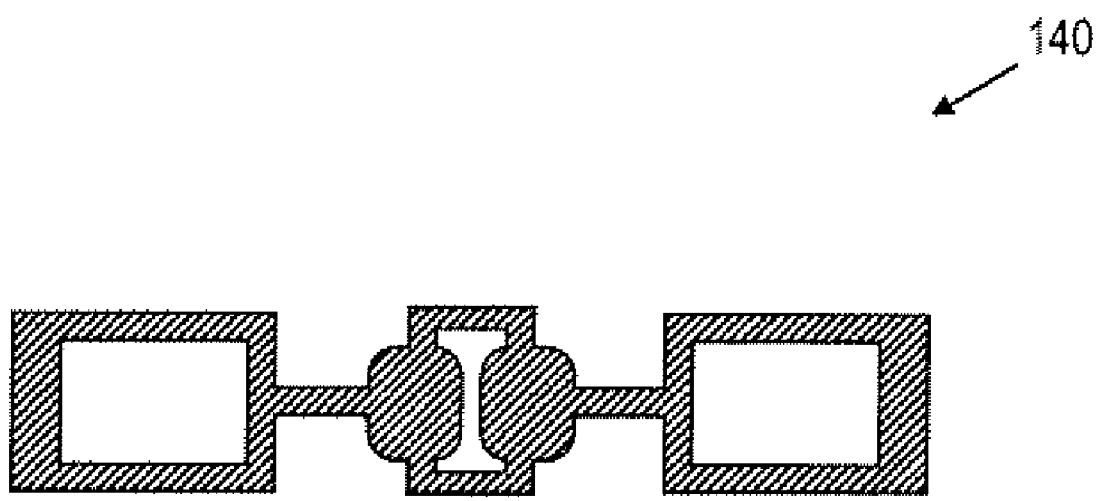
FIG. 14 is another exemplary embodiment of an antenna pattern with a scale reference shown on the figure.

FIG. 13 shows another embodiment in a top plane view of an RFID tag. This tag 130 as shown in FIG. 13 is approximately 46 millimeters long and 12 millimeters wide. The tag includes an antenna pattern 140, which resembles the antenna pattern 30 of FIG. 3 and also includes the carrier strap which is coupled between the two inductor loops. FIG. 14 shows a top plane view of the antenna pattern 40 which is part of the RFID tag 130 shown in FIG. 13.

While the foregoing description provides various examples which are provided for purposes of explanation, it will be appreciated that various alternative embodiments may be created within the spirit of this invention. For example, in one alternative embodiment, two or more loops which are arranged in a similar fashion so that all loops are in parallel can contribute to the inductance which may be chosen for tuning purposes. While certain embodiments of RFID tags of the present invention may be used with an operating frequency of 2.45 GHz, it will be appreciated that alternative RFID tags may be used at 915 MHz and other operating frequencies. However, the present invention tends to provide more benefits at higher frequencies when the inductor loop is small. The symmetry of the loops can also cause a reduction in the capacitance variation for the same reasons as given above. If one capacitor is increased, then the other is decreased and the resulting variation is cancelled to at least a first order of magnitude.

What is claimed is:

1. An electronic device comprising:
   at least one IC strap; and
   a conductor pattern coupled to the IC strap, said conductor pattern having at least a pair of inductors formed by a first inductor electrically connected to a second inductor, said first and second inductors arranged in a pattern so that a misplacement of said IC strap relative to said conductor pattern causes a change in said first inductor to compensate for a change in said second inductor.

2. The electronic device as in claim 1 wherein said electronic device is an RFID tag and wherein said pair of inductors is symmetrical relative to an axis which specifies a desired placement of said IC strap relative to said conductor pattern which is an antenna pattern of said RFID tag.

3. The electronic device of claim 1 wherein the IC strap is an RFID strap.

4. An antenna substrate for an RFID tag, the antenna substrate comprising:

a substrate; and a conductor pattern formed on the substrate in a region of the substrate which is designed to receive an IC strap, said conductor pattern having at least a pair of inductors formed by a first inductor electrically connected to a second inductor, said first and second inductors arranged in a pattern so that a misplacement of the IC strap relative to said conductor pattern causes a change in said first inductor to compensate for a change in said second inductor.

5. The antenna substrate as in claim 4 wherein said pair of inductors is symmetrical relative to an axis which specifies a desired placement of said IC strap relative to said conductor pattern which is an antenna pattern of said RFID tag.

6. The antenna substrate of claim 4 wherein the IC strap is an RFID strap.

* * * * *